(12) United States Patent
Mnich

(10) Patent No.: US 10,637,362 B2
(45) Date of Patent: Apr. 28, 2020

(54) POWER SUPPLY HAVING TWO QUADRANT CONVERTER AND TECHNIQUES FOR OPERATION

(71) Applicant: ESAB AB, Gothenburg (SE)

(72) Inventor: Andrzej Mnich, Göteborg (SE)

(73) Assignee: ESAB AB, Gothenburg (SE)

( * ) Notice: Subject to any disclaimer, the term of this patent is extended or adjusted under 35 U.S.C. 154(b) by 0 days.

(21) Appl. No.: 16/284,183

(22) Filed: Feb. 25, 2019

(65) Prior Publication Data
US 2019/0207524 A1    Jul. 4, 2019

Related U.S. Application Data

(63) Continuation of application No. PCT/IB2016/055119, filed on Aug. 26, 2016.

(51) Int. Cl.
| | |
|---|---|
| H02M 3/335 | (2006.01) |
| H02M 3/337 | (2006.01) |
| H02M 1/40 | (2007.01) |
| B23K 9/10 | (2006.01) |
| H02M 1/08 | (2006.01) |
| H02M 1/34 | (2007.01) |
| H02M 1/00 | (2006.01) |

(52) U.S. Cl.
CPC ....... *H02M 3/33576* (2013.01); *B23K 9/1043* (2013.01); *H02M 1/083* (2013.01); *H02M 1/40* (2013.01); *H02M 3/337* (2013.01); *H02M 2001/0009* (2013.01); *H02M 2001/0058* (2013.01); *H02M 2001/342* (2013.01); *H03K 2217/0036* (2013.01); *Y02B 70/1491* (2013.01)

(58) Field of Classification Search
CPC .................................................... H02M 3/335
See application file for complete search history.

(56) References Cited

U.S. PATENT DOCUMENTS

| | | | |
|---|---|---|---|
| 5,539,630 A | 7/1996 | Pietkiewicz et al. | |
| 6,297,616 B1 | 10/2001 | Kubo et al. | |
| 2001/0036088 A1 | 11/2001 | Wittenbreder | |
| 2008/0011281 A1* | 1/2008 | Kraus | F02P 3/051 |
| | | | 123/623 |
| 2011/0038182 A1* | 2/2011 | Li | H02M 3/33592 |
| | | | 363/21.06 |
| 2014/0347892 A1 | 11/2014 | Muto | |
| 2015/0229219 A1* | 8/2015 | Choi | H02M 3/33569 |
| | | | 363/21.03 |

(Continued)

OTHER PUBLICATIONS

Notification of Transmittal of International Search Report and Written Opinion including International Search Report and Written Opinion of International Application No. PCT/IB2016/055119 dated May 12, 2017, 15 pages.

(Continued)

*Primary Examiner* — Kyle J Moody
*Assistant Examiner* — Trinh Q Dang
(74) *Attorney, Agent, or Firm* — Edell, Shapiro & Finnan, LLC

(57) ABSTRACT

A power supply may include a power block to receive an input power and generate an output power; and a control system coupled to the power block, wherein the power block and control system are arranged to provide unidirectional current flow and bipolar voltage during operation of the power supply.

14 Claims, 16 Drawing Sheets

(56) References Cited

U.S. PATENT DOCUMENTS

2016/0268908 A1* 9/2016 Chang ............... H02M 3/33523
2016/0294299 A1* 10/2016 Fan .................. H02M 3/33592
2017/0030984 A1* 2/2017 Deng ..................... G01R 33/16

OTHER PUBLICATIONS

Notification of Transmittal of International Preliminary Report on Patentability of International Application No. PCT/IB2016/055119 dated Mar. 7, 2017, 1 page.
International Preliminary Report on Patentabilityof International Application No. PCT/IB2016/055119 dated Feb. 26, 2019, 11 pages.
Office Action for Canadian Patent Application No. 3,033,814 dated Feb. 6, 2020, 8 pages.
Communication pursuant to Article 94(3) EPC from the European Patent Office for EP Patent Application No. 16 770 985.6 dated Feb. 11, 2020, 4 pages.

* cited by examiner

POWER SUPPLY HAVING TWO QUADRANT CONVERTER AND TECHNIQUES FOR OPERATION

CROSS-REFERENCE TO RELATED APPLICATIONS

This application is a continuation of International Application No. PCT/IB2016/055119, filed on Aug. 26, 2016, the entire contents of which is hereby incorporated by reference.

TECHNICAL FIELD

The present embodiments are related to power supplies for welding type power, that is, power generally used for welding, cutting, or heating.

BACKGROUND

Power supplies (PS), in particular switch mode power supplies (SMPS), are designed to convert an electric energy derived from a primary source of electrical power to electrical energy having parameters different from the parameters of the energy from the primary source. The SMPS's may also provide separation of primary and secondary electric circuits. In many cases power supplies are designed to provide energy to a secondary energy receiver, such as a load, where the energy flows just from the primary source to the secondary energy receiver. In various other cases, when the receiver accumulates and/or delivers the energy, the energy may also flow from the receiver to the primary source or from the receiver to another accumulator of energy. In some examples, power supplies may deliver direct current (DC) unipolar voltage, while various power supplies may deliver alternate current (AC) voltage. Various DC power supplies may be capable of reversing polarity of output voltage according to needs.

Regarding DC power supplies it may be appreciated that DC power supplies may provide voltage of different polarity and different direction of energy flow. This situation is depicted in FIG. 1 as current-voltage quadrants (quarters) of operation. By default, when the voltage is positive, energy flows to a receiver, and the power supply operates in the first quadrant (Q-I), which may be characterized by positive voltage and positive current. The majority of known power supplies may operate just in this quadrant. Certain classes of power supplies, for instance, battery chargers or uninterruptible power supplies (UPS), may operate also in a so-called second quadrant (Q-II), where the voltage does not change polarity, while current (which may be termed negative current) flows in the reverse direction (battery is charging or discharging). The same situation may take place when a receiver is a unidirectional DC motor, which can return the energy to the primary source or intermittent energy accumulator. The bidirectional DC motor requires bidirectional voltage and can also return the energy. Thus, operation may take place in all four quadrants as shown in FIG. 1. By convention the quadrant where the voltage is negative and power flows to the receiver is called the third quadrant (Q-III), while the fourth quadrant is the quadrant where the voltage is negative and energy flows back from the receiver (Q-IV).

In view of the above, power supplies may be divided into three classes: a first class, single quadrant power supply, operating in one quadrant: Q-I or Q-III; a second class, two-quadrant power supply, operating in two quadrants Q-I and Q-II or Q-III and Q-IV; and a third class, four quadrant power supply, operating in all four quadrants. Notably, in the class of the two-quadrant power supplies, power supplies do not generally operate in Q-I and Q-IV or Q-III and Q-II, where the voltage polarity switches while the direction of current flow does not.

In the majority of welding power supplies that are DC one-quadrant power supplies, operating in Q-I or Q-III, the DC welding process requires just delivery of the energy in a controlled manner, in particular with fast changes. The output current in this process does not reverse or need to reverse its direction. However, during DC welding, the energy in the receiver is not just consumed in the welding processed, but also may accumulate in an output inductor of the power supply and in the supplying cables, which physically act as inductors. According to the principle of electromagnetic induction, the current in the inductor does not change immediately. The derivative of the current in the inductor in time (dI/dt) is proportional the voltage applied to the inductor. Therefore, for fast control of the output current it would be reasonable to reverse the output voltage of the power supply. A one-quadrant power supply can provide just positive voltage. Thus, during short circuit conditions the voltage applied to the inductors may just be positive or a very slightly negative. Consequently, while the current may increase very rapidly, the current decreases just very slowly. This circumstance represents a major drawback of a one-quarter power supply.

An example of a one-quadrant power supply 200 during the short circuit is presented in FIG. 2. The converter employs primary side full bridge (FB) formed from switches VT1, VT2, VT3, VT4 with respected reverse diodes VD1, VD2, VD3, VD4. In the example of FIG. 2, the energy flows just in one direction—from mains through the rectifier, which is schematically shown by the diode VD0. The DC bus capacitor C1 provides bidirectional conductivity, which in this case is needed just to discharge leakage and magnetizing inductances of the power transformer T1. The converter employs a center tap active rectifier (CTAP) with diodes VD5 and VD6. The output current is smoothed by means of the output inductor L2 and inductances of the output cables. The output inductor, inductances and resistance of cables and the welding load constitutes an energy receiver. As mentioned previously, because of the nature of welding, during short circuits fast control of the output current is needed. While the current can increase very fast, a fast current decrease is not achievable. When fast current decrease is commanded, all the primary switches VT1, VT2, VT3, VT4 must be off. The diode VD5 and diode VD6 are conducting in a free-wheeling manner. The voltage applied to the output inductor L2 and the inductances of the cable Lcable+, Lcable− is small, and equal to the sum of the voltage drops on the cables and the output rectifier. A similar, but not so severe situation, occurs during pulse welding. High rates of dI/dt, especially during the decreasing phase are expected; however the voltage applied over the inductances is limited due to the one-quadrant operation of the power supply.

In view of the above, known welding power supplies have been designed for forcing a reduction of current during a short circuit using a switch connected in series in the output circuit, as shown in FIG. 3 and FIG. 4, where the secondary side of a power supply is shown. In the power supply 300 of FIG. 3 or the power supply 400 of FIG. 4, under normal operation, the switch VT7 is closed (turned on) and the respective power supply delivers power and current to the welding pool. During a short circuit and when the process control requires a rapid decrease of current, the switch VT7 is opened (turned off), and the output current $I_2$ flows through the resistor R2 (FIG. 3) or through a voltage clamp depicted as an equivalent power Zener diode, VT10 (see FIG. 4). The large reverse voltage is applied to the inductors (output inductor and cables), causing a rapid decrease of the current. In the two power supplies, the energy accumulated in the inductances is dissipated, either by the resistor R2 or by the voltage clamp (VT10), which processes may be very ineffective. In addition, terminating current of levels 300 A to 400 A may cause big voltage surges and may require utilization of ineffective high voltage devices and snubbers.

With respect to these and other considerations, the present disclosure is provided.

BRIEF SUMMARY

In one embodiment, a power supply, may include a power block to receive an input power and generate an output power, and a control system coupled to the power block, wherein the power block and control system are arranged to provide unidirectional current flow and bipolar voltage during operation of the power supply.

In another embodiment, a method of operating a power supply for welding may include providing during a first interval a first energy flow between a source of energy and an energy receiver, wherein a source current flows in a first direction; wherein an output current flows in the first direction and an output voltage of the power supply has a first polarity; providing during a second interval a second energy flow between the energy receiver and the source of energy, wherein the source current flows in a second direction, opposite the first direction, and wherein the output current flows in the first direction and the output voltage of the power supply has a second polarity opposite the first polarity; and providing during a third interval a zero energy flow, wherein current does not flow through the source of energy and a current circulates in the first direction in the receiver.

DESCRIPTION OF EMBODIMENTS

Figure 1:
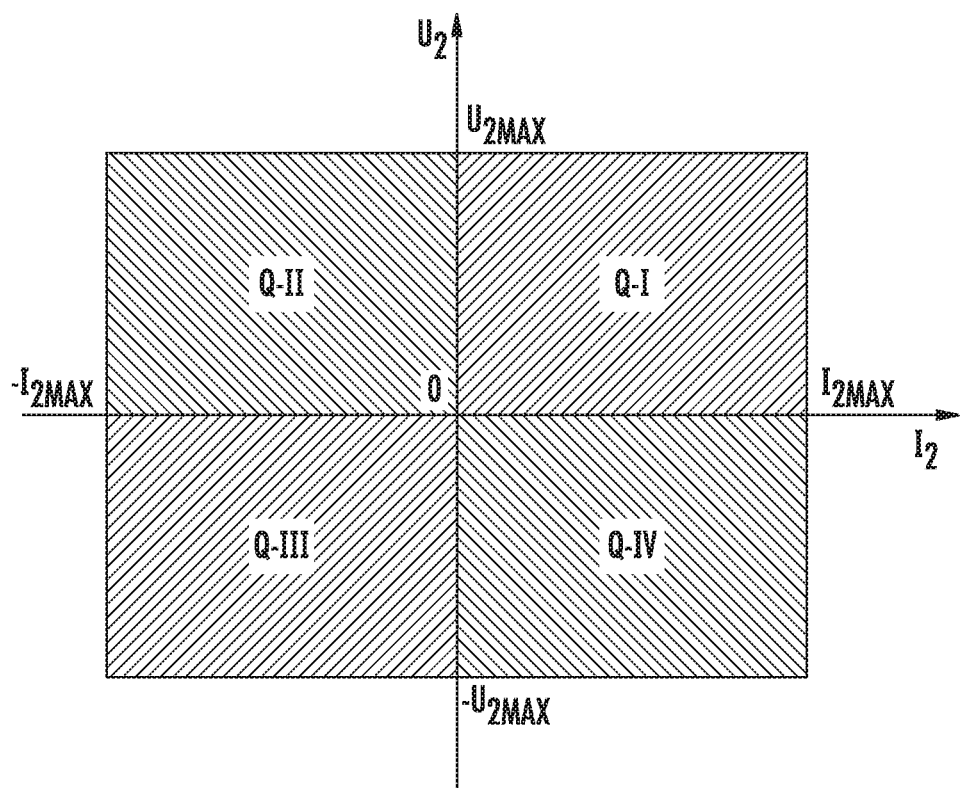
FIG. 1 illustrates principles of operation of power supplies according to current-voltage quadrants.
Figure 2:
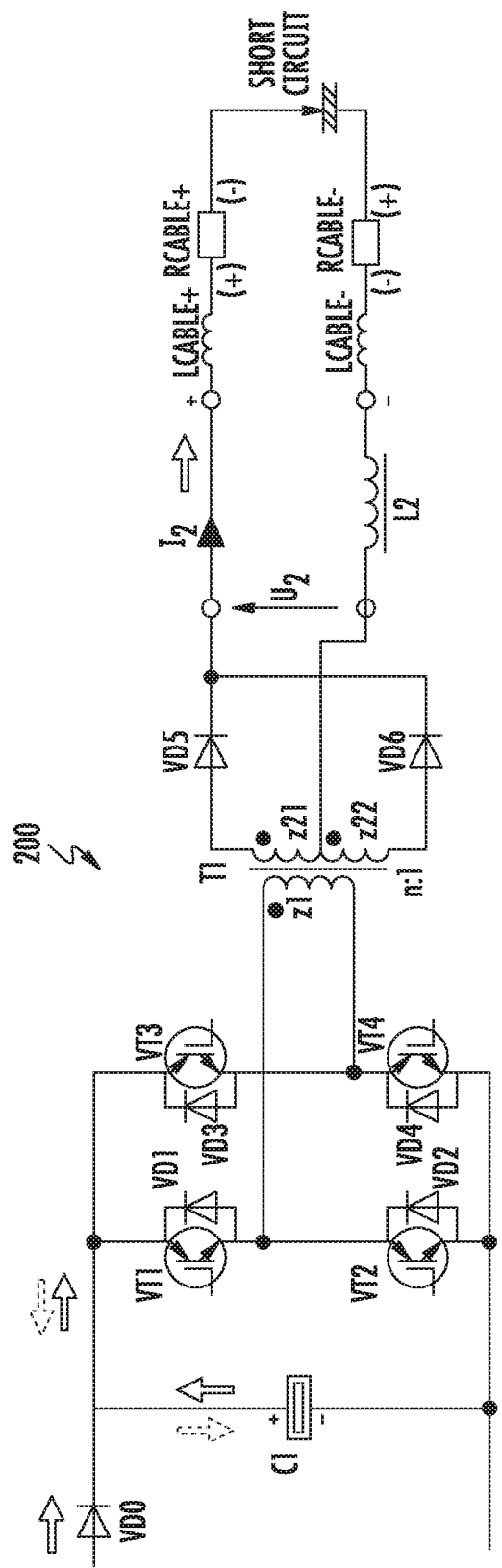
FIG. 2 depicts a known circuit diagram of a one-quadrant power supply for welding.
Figure 3:
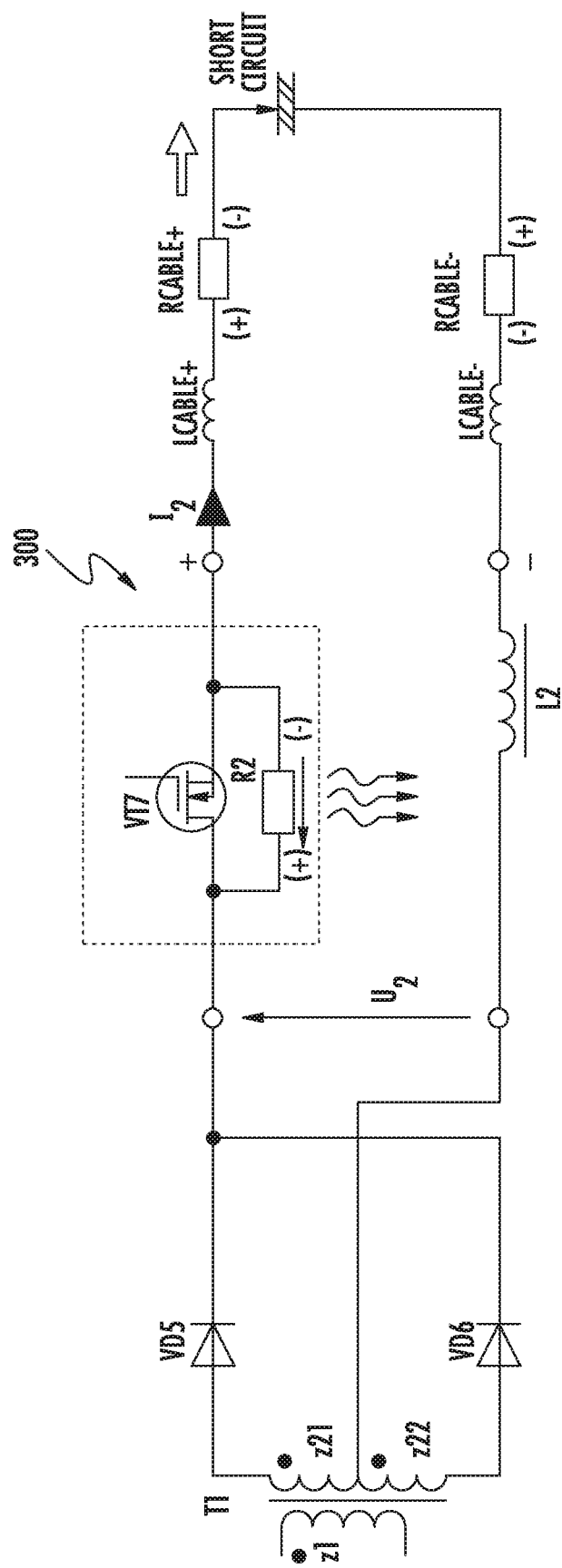
FIG. 3 depicts a known circuit diagram of another one-quadrant power supply for welding.
Figure 4:
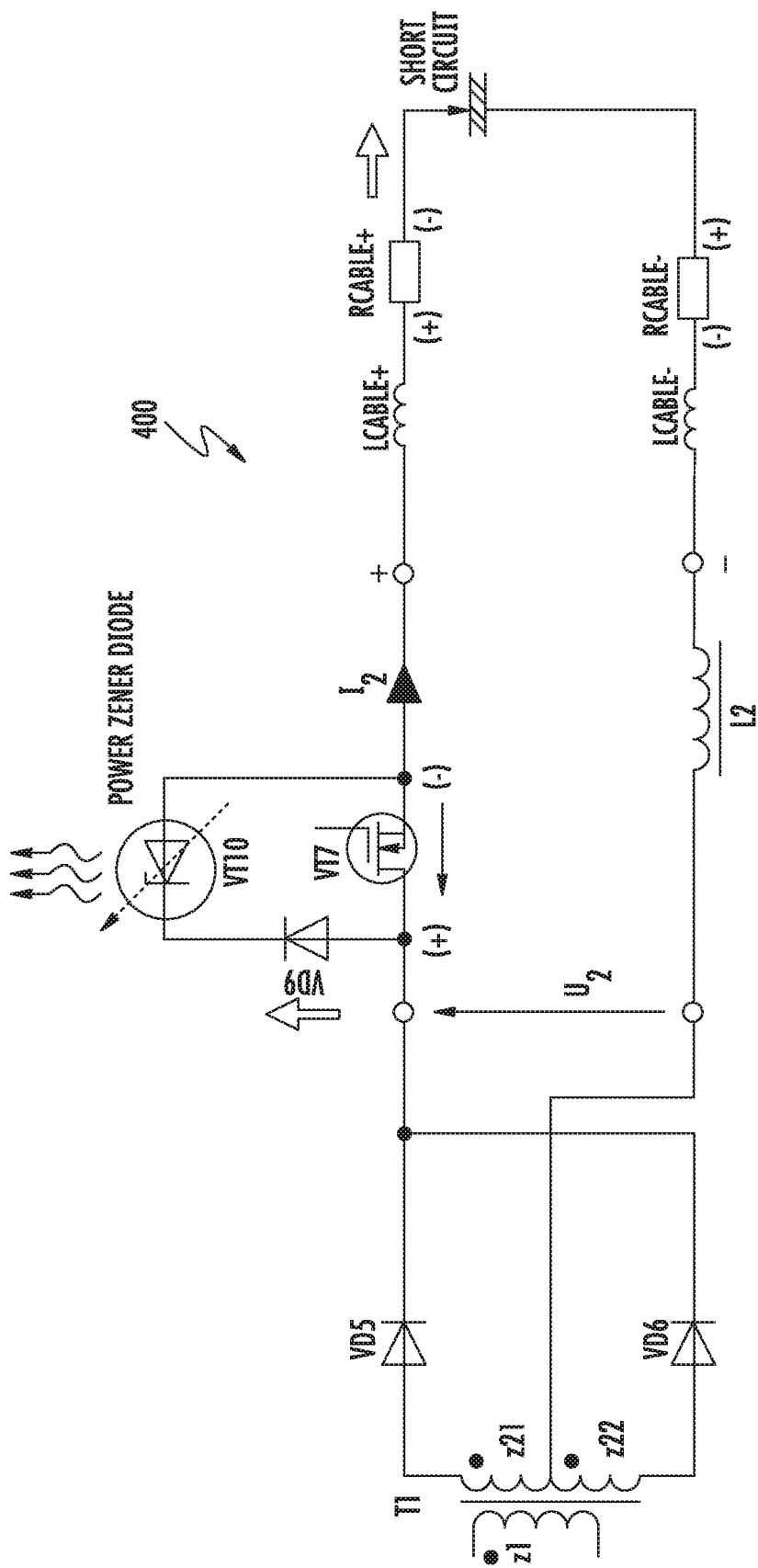
FIG. 4 depicts a known circuit diagram of another one-quadrant power supply for welding.

Various embodiments provide power converter topologies and techniques for controlling the converters, providing for reversal of the output voltage and reversal of the direction of the energy flow. Various embodiments are related to switched mode power supplies (SMPS's) having an isolated output, operated via pulse width modulation (PWM) control or derivatives of PWM control, such as hysteretic control, constant on-time control or other technique, where control is provided by switching devices located on the primary side as well as the secondary side of the converter. In various embodiments, a 2-quadrant power converter (or power converter) is provided. Various converters arranged according to present embodiments provide unidirectional current flow and bipolar voltage, providing the operation in two neighboring quadrants, such as Q-I and Q-IV, or Q-III and Q-II, as shown in FIG. 1. Converters arranged according to the present embodiments are related to a class of bidirectional converters, providing the possibility of reverse flow of accumulated energy. Accordingly, the present embodiments provide improved efficiency of power conversion in comparison with known methods and topologies, intended for fast current transitions.

Various embodiments of the disclosure provide simple and effective architectures and techniques in comparison with other methods and topologies, intended for fast transitions of unipolar current. In comparison to one-quadrant converters as a base topology, the two-quadrant converters contain two or more additional switches with drivers. The needed additional complexity may be placed in a controller, avoiding unnecessary components that may add materials cost and manufacturing complexity. While various embodiments provide power converters for use in welding apparatus, additional embodiments of the disclosure may be used for power supplies in other applications.

In various embodiments, a common feature of topologies of a two-quadrant welding power supply is implementation of the active output rectifier comprising controlled rectifiers equivalent to switches arranged in series with rectifiers, used to temporarily disable the freewheeling period, when by definition, a secondary current circulates on the secondary side, bypassing the primary source of energy. One of the control rectifiers is turned off, or remains in a turned-off state to restrain freewheeling. The current forced by the energy accumulated in the output inductors is reflected to the primary side where the current flows to an accumulating capacitor, charging up the accumulating capacitor. Since the period of energy return is periodically alternated with the period of the energy delivery, the overall efficiency is increased.

As noted, various embodiments of the disclosure provide power supplies, such as welding power supplies having a two-quadrant conversion topology, such as operating in Q-I and Q-IV. Additional embodiments provide termination of free-wheeling operation of an output rectifier by means of controlled rectifiers.

In various embodiments disclosed herein novel architecture and detailed techniques are disclosed facilitating operation of a two-quadrant conversion power supply.

In one embodiment, an apparatus to provide welding power may include a power block that comprises an input capacitor or equivalent energy accumulator and a primary converter having a plurality of switches, wherein the control system comprises circuitry to generate pulse width modulation control of the primary converter.

In a further embodiment, an apparatus to provide welding power may include a power block that comprises a primary side and a secondary side, the primary side and secondary side being coupled to one another via a transformer, wherein the secondary side comprises an active rectifier block.

In a further embodiment, an apparatus to provide welding power may include a power block that comprises an inductor on the secondary side; and the inductor together with inductances and resistance of cables and the welding load constitute an energy receiver.

In a further embodiment, an apparatus to provide welding power may include a secondary active rectifier of various topology that comprises a plurality of controlled rectifiers wherein the control system comprises circuitry to generate pulse width modulation control of the secondary active rectifier block.

In a further embodiment, an apparatus to provide welding power may include a control system that employs the primary and secondary current transducers or magnetic flux transducer, other current transducers or sensors and voltage sensors in purpose to identify points of the operation.

In a further embodiment, a method is disclosed for controlling a welding power block where at a given output current direction the output voltage can be reversed by the operation of a secondary active rectifier, enabling the transfer of energy in a reverse direction.

In a further embodiment, a method is disclosed for controlling a welding power block where a primary power converter may be employed to direct the flow of current inside the output active rectifier enabling the switching off of controlled rectifiers at a zero current condition.

In a further embodiment, a method is disclosed of controlling a welding power block where a reverse output voltage interval is followed by a free-wheeling operation interval for control of the balance of the flux in the core of a power transformer and the regulation of the average output voltage.

In a further embodiment, a method is disclosed for controlling the operation of a welding power block during the period of reversed output voltage for balancing the flux in the transformer employing primary current transducers and secondary current transducers or a flux transducer.

In a further embodiment, a method is disclosed for controlling the zero current condition in a controlled rectifier of secondary output rectifiers employing the secondary current measurement or controlled rectifier voltage sense or controlled rectifier current sense.

In various embodiments of the disclosure, as detailed below, converter topologies are provided where an active rectifier is implemented in a basic converter topology, including: a full bridge (FB) or equivalent primary side converter, with active (CRTAP) (FIG. 6.); a FB or equivalent primary side converter, with full bridge active rectifier (FIG. 7.); a FB or equivalent primary side converter with active current doubler (CD) active rectifier (FIGS. 8A-8D). In additional embodiments, techniques are provided for controlling the aforementioned topologies of a full bridge converter or equivalent, including isolating transformer of bipolar magnetization equipped with different active rectifiers.

Figure 5:
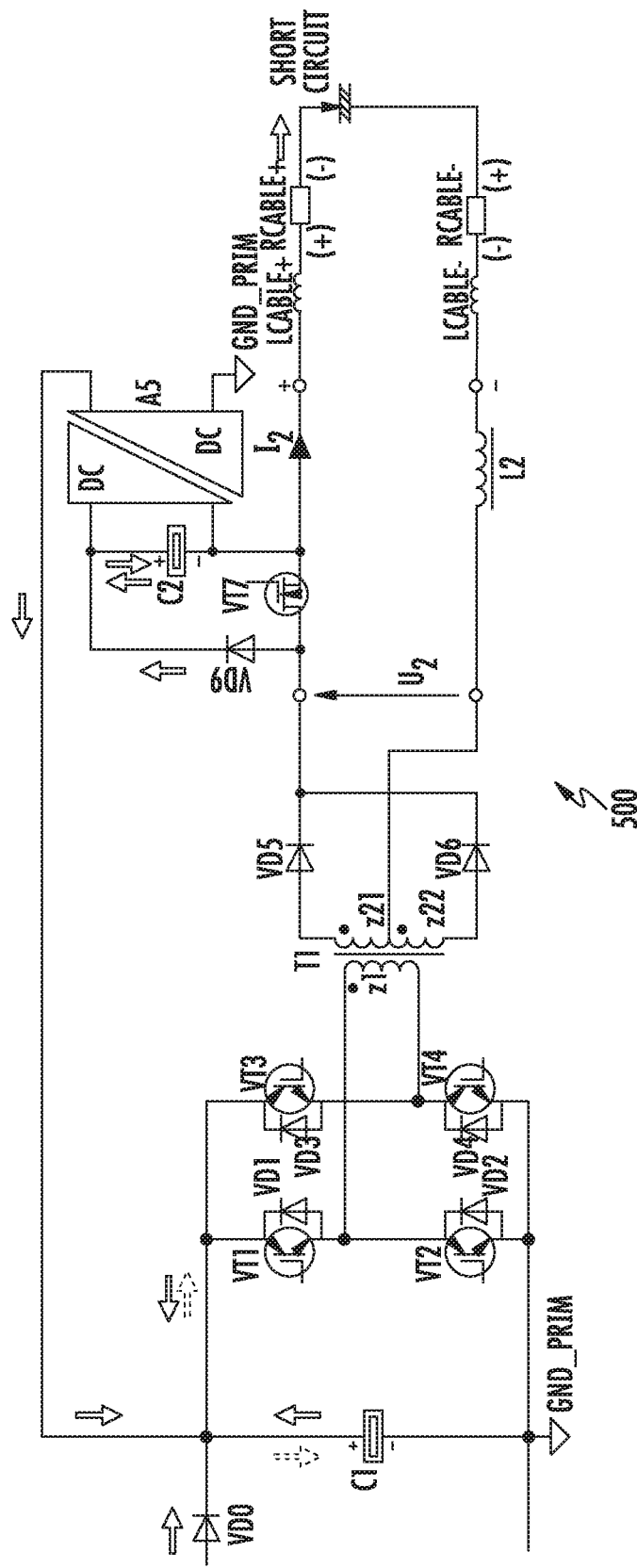
FIG. 5 depicts the topology of a power supply where a voltage clamp is provided on the secondary side.

By way of background, FIG. 5 depicts the topology of a power supply 500 where a voltage clamp on the secondary side contains accumulating capacitor C2. In this topology, the energy from this accumulator can be used for consecutive welding phase. Once the control of the output current or power is performed using the primary converter, the energy needs to be transferred from the capacitor C2 to the capacitor C1 through the isolating barrier. In particular cases this may be accomplished using a DC-DC converter A5 of limited power, operating in between the clamp operation cycles. In this manner, the power supply of FIG. 5 presents a converter operating in two-quadrants having a voltage clamp and auxiliary DC-DC converter operating in two-quadrants. Such a power supply may be energy effective, but suffers from a high degree of complexity and expense to manufacture.

Figure 6:
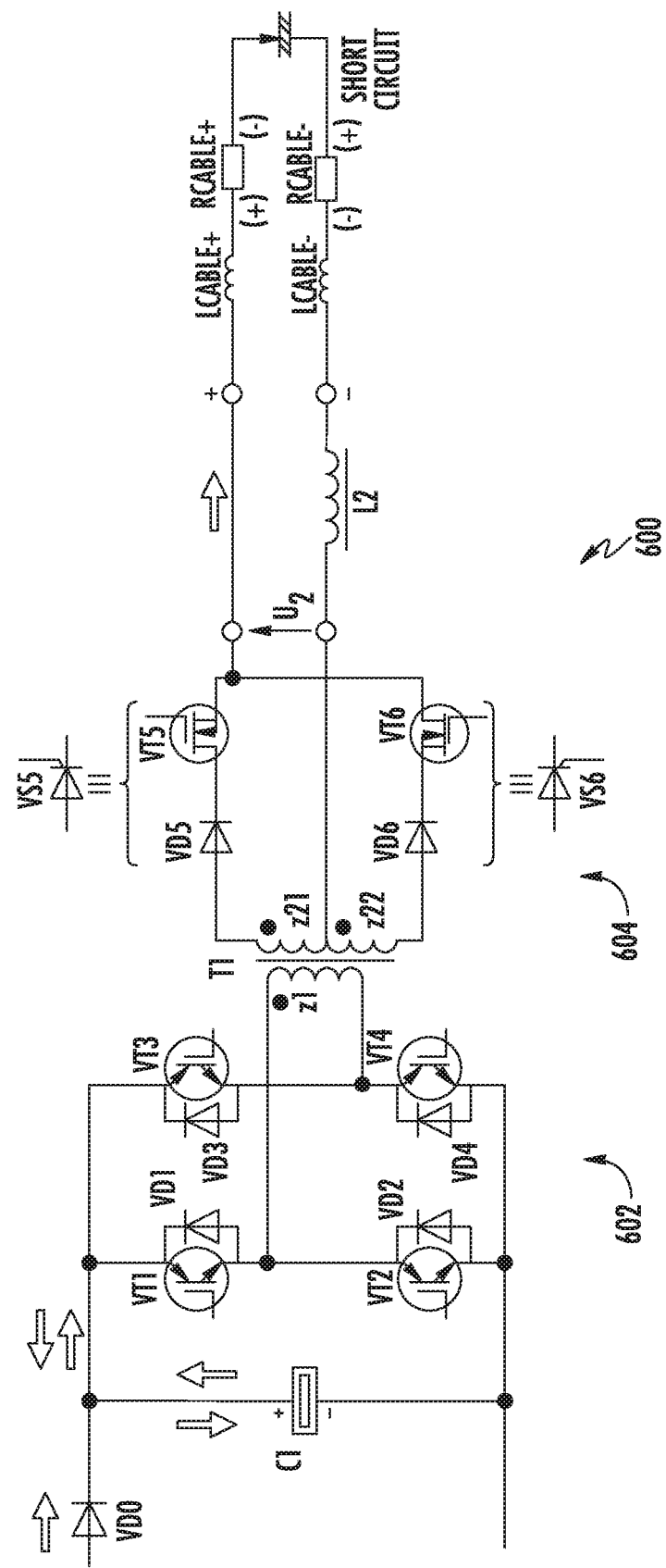
FIG. 6 shows a power supply arranged according to embodiments of the disclosure.

In various embodiments of the disclosure a power supply may include an active rectifier block formed from a pair of controlled rectifiers, where the pair of controlled rectifiers provide equivalent operation to a pair of switches coupled in series to a respective pair of diodes Turning now to FIG. 6, there is shown a power supply 600 arranged according to embodiments of the disclosure. In this embodiment, the primary converter 602 is arranged as a full bridge converter (FB converter) with a transformer, while the secondary rectifier 604 is a center tap (CRTAP) active rectifier.

Two secondary switches VT5 and VT6, each in series with the one rectifier VD5 or VD6, are used in this embodiment. In alternative embodiments single devices—controlled rectifiers VS5 and VS6 may replace the switch and the diode connected in series. The controlled rectifiers may accordingly provide equivalent electrical operation to a switch and diode connected in series. The circuit further includes output inductor L2 and cable inductances Lcable+, Lcable. During Q-I operation of the power supply 600, the secondary switches VT5 and VT6 are conducting continuously. Thus, the operation of the converter is similar in some respects to operation of known FB converters with a CRTAP rectifier. When Q-IV operation is needed, primary switches VT1, VT2, VT3, and VT4 may be mostly switched off, while diodes VD1, VD2, VD3, and VD4 form a primary bridge rectifier with DC bus capacitor C1 on its output. When secondary current circulates during a free-wheeling phase through the two diodes, VD5 and VD6, no current flows through the primary bridge rectifier, except the magnetizing and leakage inductances discharging current. When just one of the switches VT5 or VT6 is turned off, there is no way for free-wheeling current to exist, so the current is forced to be transformed to the primary side of the power supply 600. Since a bridge rectifier now is formed by the diodes of the FB (primary converter 602), the transformed current flows into the capacitor C1, charging up the capacitor C1. During this phase, the voltage of the particular polarity is applied to the transformer, for a limited time defined by the maximum volt-second product of the transformer. At this point, the polarity of the voltage applied to the transformer T1 is to be reversed and this process is to be repeated periodically. Notably, in the same way as for direct power conversion the current alters the manner of conduction back and forth from one rectifier diagonal (VD1-VD4 or VD2-VD3) to the opposite. When just one of the rectifier's diagonal is conducting and all primary switches VT1, VT2, VT3, and VT4 are off, the voltage on the output of the rectifier is negative, and the energy from the secondary inductors L2, Lcable+, Lcable− is transferred to an energy accumulator, in this case, to an input capacitor C1. In other embodiments an energy accumulator such as a battery may be used instead of the input capacitor C1. Oppositely to the operation of the primary converter 602 in Q-I, the energy accumulated in the output inductances is transferred through the transformer T1 when just one of the switches VT5 or VT6 is off.

At this point, PWM regulation may be applied to regulation of the OFF times, both for a control of the average negative voltage on the output and following a volt-second balance on the transformer T1. During operation in the Q-IV phase, primary switches may be left in a turned-off state continuously, since then the active switches are located on the secondary side of the transformer T1, while the rectifier is on the primary side. This generates the need to control the blocking voltage on the secondary switches, during an OFF transition. Due to leakage inductance of the transformer T1 and stray inductances in the circuit, turning secondary switches off may causes voltage surges. The secondary switches need to withstand high voltage in this circumstance, or clamping to protect secondary switches is needed. This circumstance makes the operation and construction of the power supply 600 somewhat complex and expensive. Advantageously, the presence of the primary switches makes it possible to force the commutation of the secondary diodes, from the free-wheeling phase to power delivery phase. When the current in a particular diode is no longer flowing, a switch can be switched off in a zero current switching condition (ZCS), while not needing excessive voltage clamping.

Figure 7:
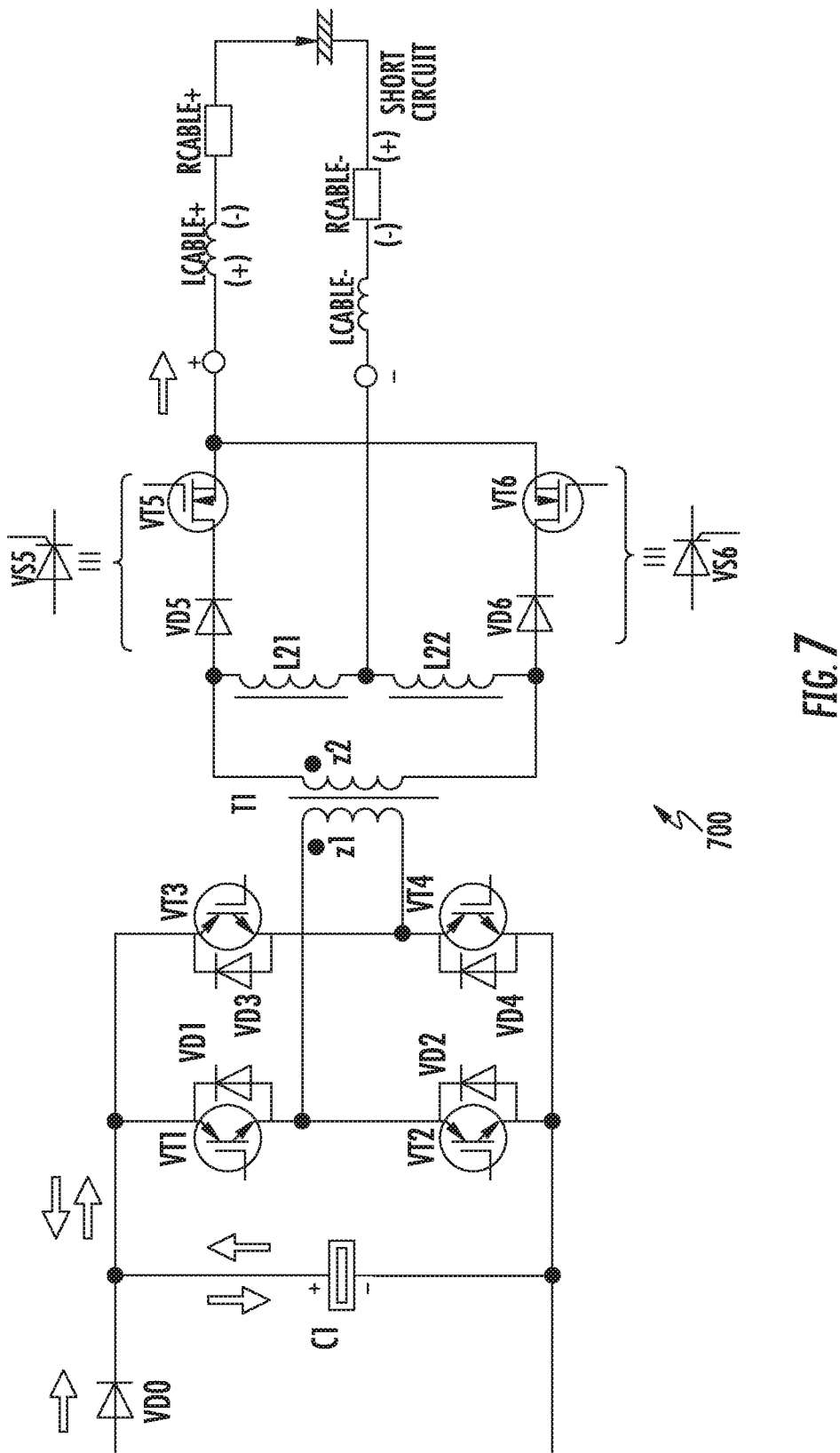
FIG. 7 shows another power supply arranged according to embodiments of the disclosure.
Figure 8A:
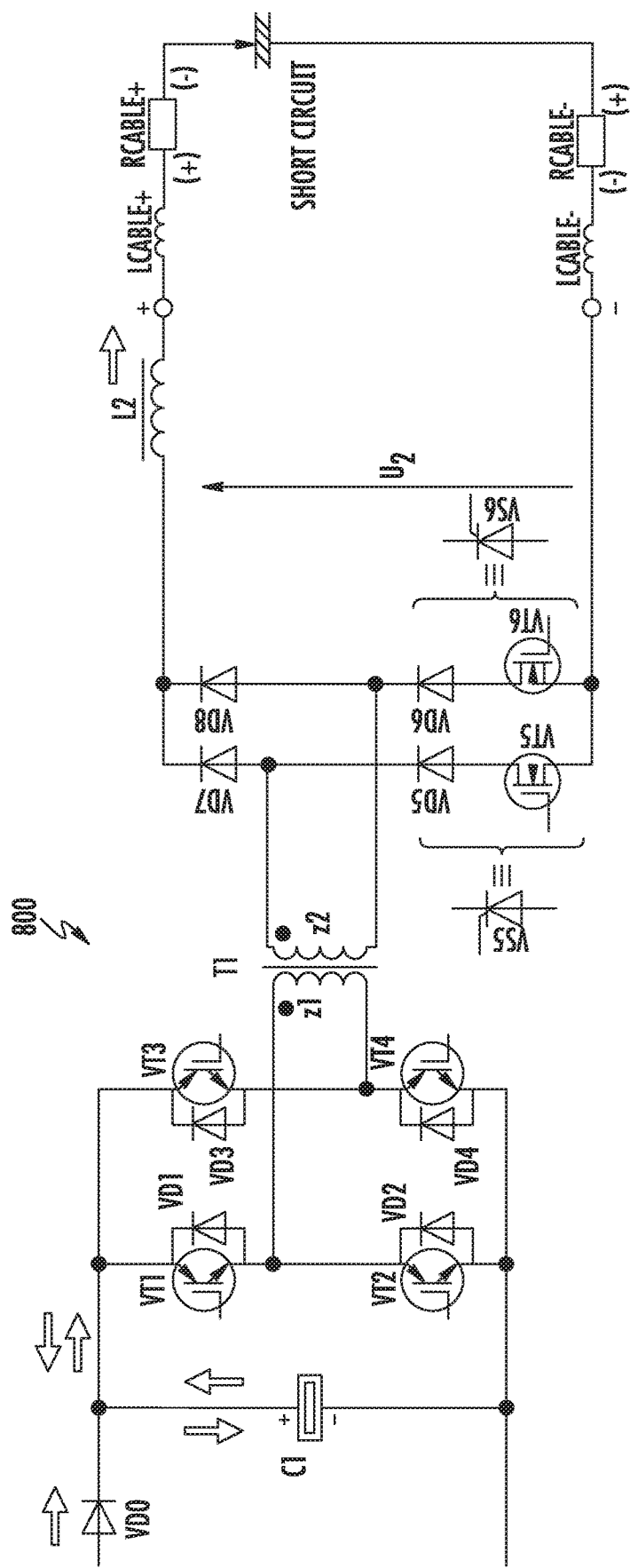
FIG. 8A shows a further power supply arranged according to embodiments of the disclosure.

Notably, in various embodiments of the disclosure, active clamping or ZCS may be used. In some embodiments to follow, particular variants where a power supply employs ZCS are disclosed in more detail. Turning now to FIG. 7 and FIG. 8A there are shown a power supply 700 and power supply 800, respectively, according to embodiments of the disclosure, where the topologies have different output rectifiers. In comparison to the embodiment of FIG. 6, in the embodiments reflected in FIG. 7 and FIG. 8A, the primary side of the power supply, the manner of control, and the control system may remain the same as for the power supply of FIG. 6. Either of the topologies may be applicable in instances when it is preferable to have a single secondary winding. The power supply 700, having a current doubler (CD) topology may be advantageously applied for minimizing the output current ripple, for example. Advantageously, the FB rectifier topology (FIG. 8A), maybe employed under circumstances of higher voltage output.

Figure 8B:
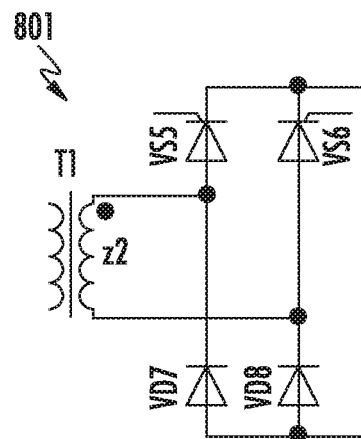
FIG. 8B shows an active rectifier for use in the embodiment of FIG. 8A according to embodiments of the disclosure.
Figure 8C:
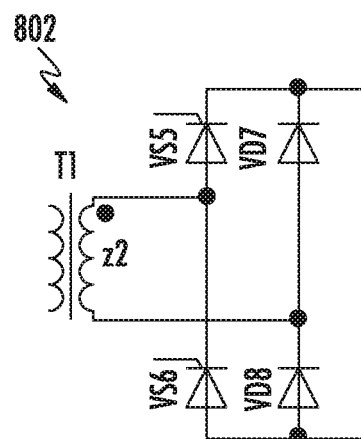
FIG. 8C shows another active rectifier for use in the embodiment of FIG. 8A according to embodiments of the disclosure.
Figure 8D:
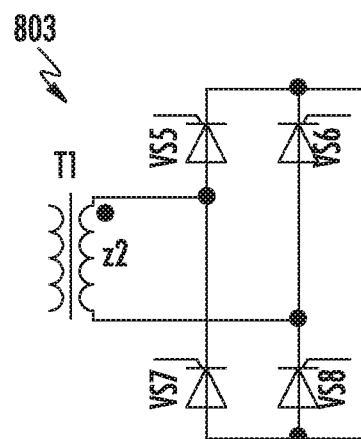
FIG. 8D shows a further active rectifier for use in the embodiment of FIG. 8A according to embodiments of the disclosure.

In particular the active FB rectifier on the secondary side may comprise two controlled rectifiers with common anode (shown in power supply 800 discussed above); two control rectifiers with common cathode, shown in rectifier 801 of FIG. 8B, two control rectifiers in one arm, shown in rectifier 802 of FIG. 8C, or all four controlled rectifiers, shown in rectifier 803 of FIG. 8D. In particular, the present embodiments cover topologies of the primary side converters including a full bridge converter or equivalent converter providing bipolar magnetization of the transformer. Equivalent converters providing bipolar magnetization of the transformer may include half-bridge converter, three-level converter and push-pull converter.

Figure 9:
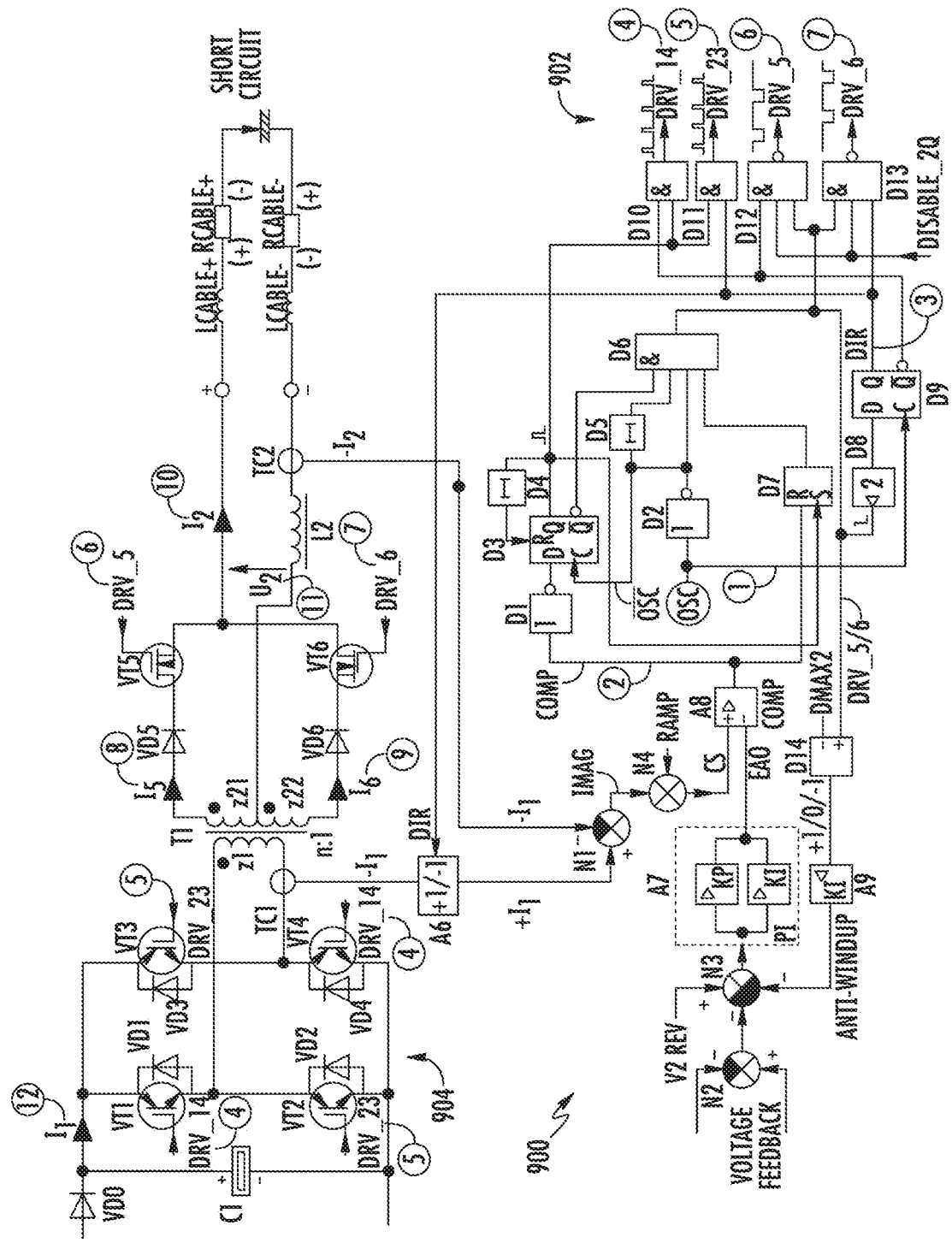
FIG. 9 yet another power supply arranged according to embodiments of the disclosure.

Turning now to FIG. 9, an embodiment of a power supply 900 is shown, where a control system 902 is depicted. Notably, the control system 902 may be employed in the power supply topologies of the various embodiments of the disclosure. In the example of FIG. 9, the topology of power supply 900 is FB with an active CRTAP rectifier, as in FIG. 6. Notably, the principles and the structure of the control system 902 are applicable to other equivalent topologies, including topologies of the active rectifiers presented in FIG. 7 and FIG. 8. In some variants of the embodiment of FIG. 9, the primary side topology, exemplified by a FB converter 904, may be replaced with equivalent primary topologies such as: a half-bridge converter, three-level converter, or push-pull converter. Due to bipolar excitation, the transformer is subject to the phenomenon of flux walking, and consequently with the possibility of saturation. The latter circumstance would mean termination of the operation and a fatal failure. Therefore, means of protection against the saturation are needed. During the operation in Q-I, the converter of power supply 900, as discussed before, may operate as a known FB converter, wherein known means of prevention against saturation may accordingly be used. In particular, a peak current mode control (PCM) with current sensing on the primary side is a well-known method. The primary current is the sum of the reflected secondary current and magnetizing current of the transformer. The two fractions have the same polarity and derivative. Therefore, it is possible to balance magnetizing current using PCM with primary current sense. Other known methods may also be applied as a means of protection against saturation or preventing flux walking.

During operation in the Q-IV quadrant, the derivative of magnetizing current has the opposite sign to the derivative of the reflected secondary current. When magnetizing current increases, the reflected current decreases and vice versa. This fact means that the primary current sense cannot be used directly for magnetizing current balance. Therefore a measuring system that delivers the signal proportional to the magnetizing current may be required. According to the power supply 900 of FIG. 9, the control system 902 may include a summing node N1, where the secondary current signal from the secondary current sensor TC2 may be subtracted from the primary current signal from the primary current sensor TC1 in the summing node N1, thus generating a unipolar signal proportional just to the absolute value of the magnetizing current. This signal may therefore be used for flux balance during the operation of the power supply 900 in the Q-IV quadrant. As shown in FIG. 9, the control system 902 further includes a sign alternator A6 and PWM phase trigger D9. To obtain the proper polarization of the magnetizing current sense signal, the primary current of the transformer may go earlier through the sign alternator A6, which is driven by the output of the PWM phase trigger D9, shown as signal DIR. The output signal from the summing node N1 proportional to the absolute value of the magnetizing current is summed with the ramp signal in the node N4 of control system 902. In this way the ramp will be modified by the magnetizing current and thus provides protection against the core saturation. The polarity of signals creates a negative feedback on the transformer's magnetization. When the magnetizing current goes up more the duty cycle is shortened, consequently reducing the magnetization in a particular direction and vice versa. Eventually the transformer tends to operate with a balanced magnetization.

Using the control system 902 of FIG. 9, the voltage feedback and the zero current switching of the switches of the output active rectifier may be applied during the operation in the Q-IV as in the embodiment of a power supply. As further shown in FIG. 9, the control system 902 includes a node N2 and node N3. Differential voltage output from the node N2 is provided to the node N3, where it is subtracted from a reference value V2rev. As further shown in FIG. 9, a feedback amplifier A7 is provided to deliver a signal to a comparator A8, where it is compared with the ramp, and a PWM signal is then created. The operating cycle starts from the termination of the free-wheeling phase, when the switches VT1 . . . VT4 are off and the two active rectifier switches, VT5 and VT6, are on. When the negative voltage on the output is lower than V2rev the negative transition of the oscillator signal sets the trigger D3. As shown in FIG. 9, the trigger D3 is automatically reset after a given delay produced by D4, where the given delay is dependent on the secondary current, by virtue of the coupling of D4 to TC2. Depending on the phase (trigger D9, signal DIR), a short pulse appears on the output of D10 or D11, driving a pair of the primary switches—VT1, VT4 or VT2, VT3. Since the two arms of the active rectifier are conducting, the voltage of a given polarity is applied to leakage inductances of the transformer T1. As the output voltage goes positive the current in one arm of the active rectifier starts to decrease, and the current in the opposite arm increases. The commutation process ends when the current in the first arm falls to zero and all the output current is conducted by the opposite arm. At this point, the non-conducting switch may be switched in a ZCS condition. The pulse applied to the primary switches is long enough to cover the commutation processtime.

As further shown in FIG. 9, the primary switches pulse also sets a PWM trigger D7, which is later reset by the output of the PWM comparator A8. This architecture ensures that any given OFF pulse of the secondary switch VT5 or secondary switch VT6 is preceded by the forcing of a ZCS condition. Notably, to secure the proper timing and logic relationship, a delay D5 and the logic AND gate D6 are implemented in the PWM track. In variants of the control system 902, other delays needed for proper operation may be employed, while not changing the principles of the operation. They are neither considered nor shown here for clarity.

As further shown in FIG. 9, in control system 902, NAND logic gates D12, D13 are implemented to direct signals to the correct switch, and to provide the possibility of keeping the secondary switches in an ON state by means of a DISABLE_2Q signal. The flip-flop D8 may be triggered by any given OFF signal generated by the control system on the output of D6. The state of the flip-flop D8 is re-written to the PWM phase trigger D9 synchronously, using pulses from the oscillator OSC.

In order to prevent the saturation in voltage feedback, anti-windup feedback may be added. As shown in FIG. 9, the common PWM signal of the secondary rectifier signal—DRV_5/6 may be compared with the signal of the maximum duty cycle Dmax2 using a logic comparator D14 with a 3-state output. Depending on the phase difference between the signal Dmax2 and the actual duty cycle signal DRV_5/6, the output of the D14 may be positive, negative or zero. The digital signal from D14 is accumulated in the integrator A9 and delivered as a negative feedback to the summing node N3. In various embodiments, the anti-windup circuit may be built in any equivalent way, in particular in a fully digital manner, while in other embodiments, the anti-windup circuit may omitted.

Figure 10:
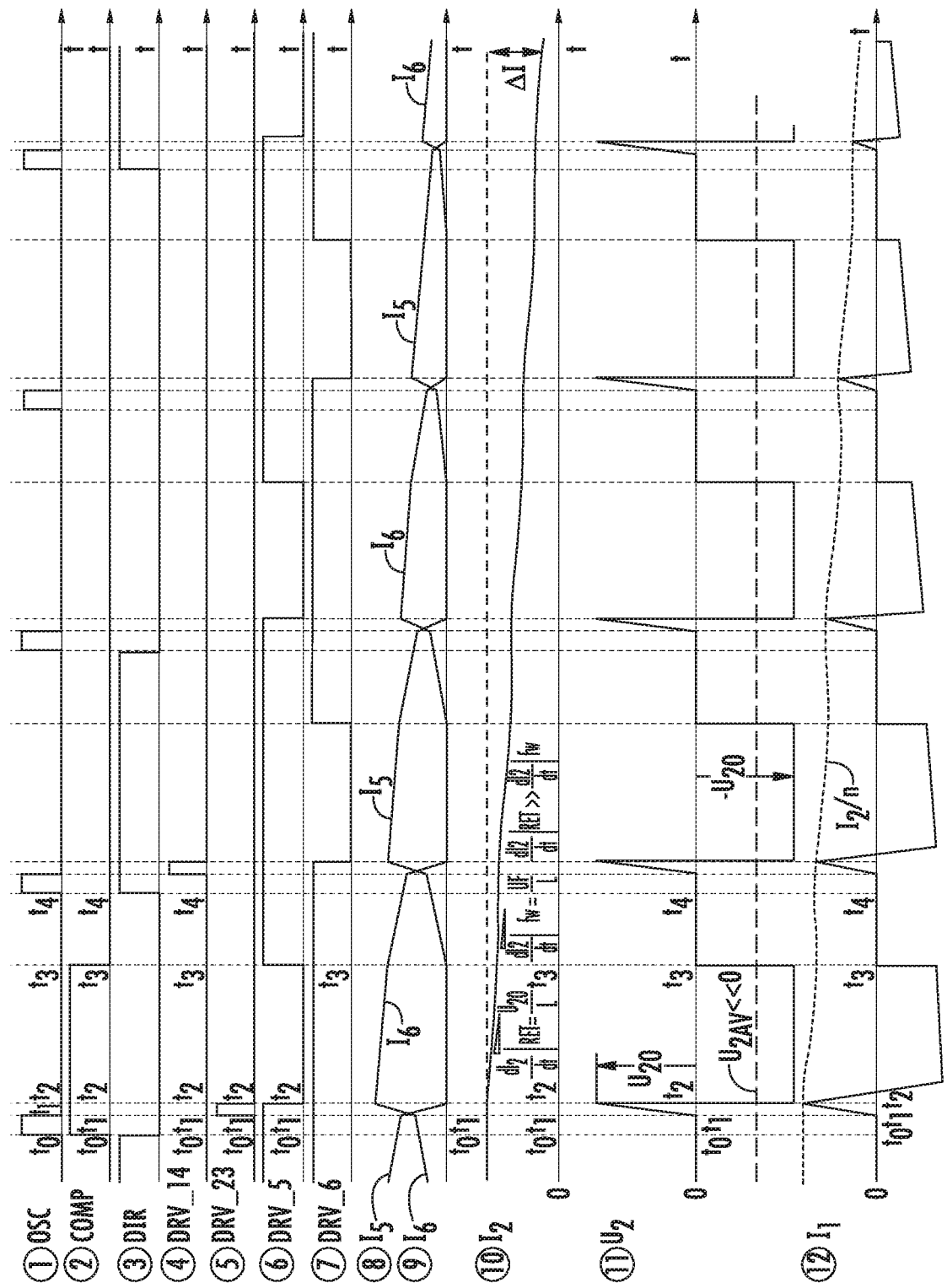
FIG. 10 shows an exemplary timing diagram for operation of the power supply of FIG. 9.

Turning now to FIG. 10, the principles of operation according to various embodiments are presented as timing diagram FIG. 10. The signals shown in FIG. 10 are referenced to the names and numbers presented in FIG. 9. The operation depicted in FIG. 10 starts from a free-wheeling phase. The output current $I_2$ circulates through the output rectifiers VD5-VT5 and VD6-VT6. No power is transferred through the transformer T1. At the moment to the generation of the oscillator OSC pulse takes place. The pulse length will define the absolute maximum of the duty cycle of the secondary rectifier operation (maximum OFF state of VT5 or VT6). At the moment $t_1$, the pair of primary switches VT2 and VT3 is turned on. The positive voltage $U_2$ applied to the leakage inductances (not shown in the description) leads to the commutation of the current from the diode D5 to the diode D6. Notably, the positive output voltage between $t_1$ and $t_2$ may appear different from the form shown in the diagram FIG. 10. In a simple model not including parasitic elements, the voltage would have a rectangular form. In other cases, taking into account leakage inductance and the parasitic capacitances, a transition would have a resonant character. At the moment $t_2$ the current I5 in the diode VD5 falls to zero and the switch VT5 may be switched off in a ZCS mode. At the same moment, drive signals from the switches VT2 and VT3 are removed. The free-wheeling period is now terminated. Now just the VD6-VT6 active rectifier is conducting the output current. The secondary current $I_2$ is transformed to the primary side. Since current is flowing through the $z_{22}$ winding this forces current to flow through the primary diodes VD1 and VD4 and back to the DC bus capacitor C1. The energy aggregated in the output inductances flows back to the input accumulator of the energy. Due to operation of the primary diodes VD1 and VD4, the output voltage $U_2$ inverts polarity. The voltage feedback and the magnetizing current control terminates this phase of the operation at the moment $t_3$, by the turning on of the VT5 switch and starting of the free-wheeling phase. At the moment $t_4$ a new cycle of the operation is started, repeating the previous sequence of the operations, in this case by means of the complementary switches and opposite magnetization of the transformer.

As previously mentioned, during the $t_3$-$t_4$ phase the voltage at the output is reversed; notably, the current still flows in the same direction. This fact has two consequences. Firstly, now energy flows from the secondary to the primary side. Secondly, the negative voltage applied 00 to the output inductances is increased by the value $U_{20}$, incomparably bigger than the single forward voltage drop on the rectifier. Therefore, during the short circuit phase, where there is almost no voltage on the load, the secondary current falls down much faster than during a short circuit at a free-wheeling state. In addition, the majority of the energy aggregated in the output is returned to the input capacitor C1, which return increases the conversion efficiency. The average secondary voltage $U_{2AV}$ and the average primary current $I_{1AV}$ are essentially negative, comparing the close to zero values in the equivalent Q-I converter.

In other applications, a more convenient implementation may involve an operation applying the maximum available duty cycle or using a given reference duty cycle. In such cases, the voltage is feedforward regulated. The main feedback performs then just a role of protection against transformer core saturation, or balancing the flux in the transformer core.

Figure 11:
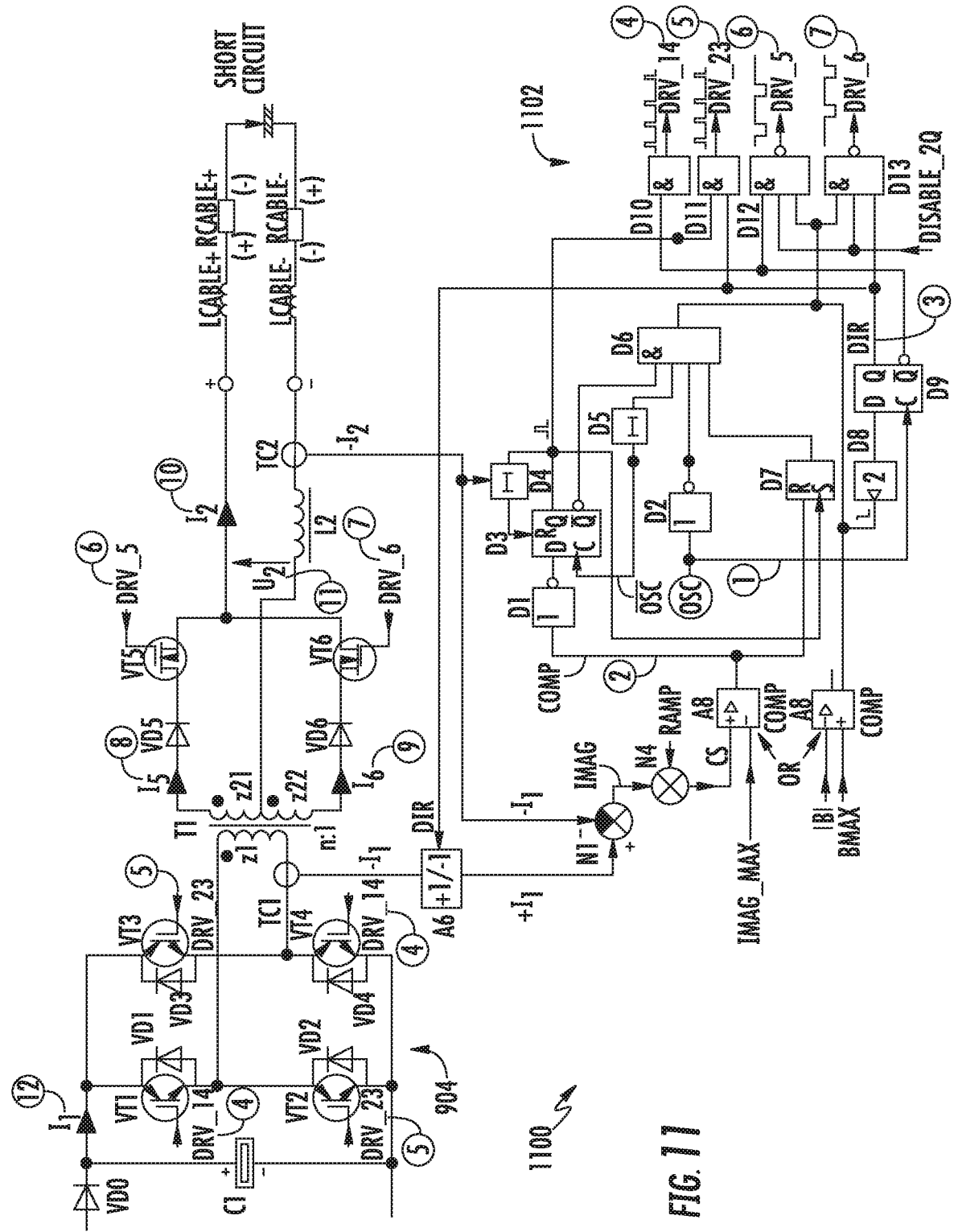
FIG. 11 illustrates still another power supply arranged according to embodiments of the disclosure.

Referring again to FIG. 9, in one embodiment, the signal EOA from the error amplifier A7 may be replaced by a given constant reference value, proportional to the expected maximum magnetizing current Imag max. This embodiment is depicted in FIG. 11, where the power supply 1100 includes a control system 1102 that does not include the error amplifier A7. In this configuration, the converter may operate at a maximum duty cycle, unless an approach of saturation is not detected. When the core of transformer T1 is approaching one-side saturation, the comparator A8 instantly terminates the active phase, and further magnetization is prohibited until the beginning of the opposite polarity magnetization. The control system 1102 contains just a simple protection against the saturation. The control system 1102 according the present embodiment uses the measuring system that restores the magnetizing current as the superposition of the transformer's primary current and the secondary current. The magnetizing current signal can be derived from various combinations of all currents, periodically flowing through the transformer. In a particular embodiment, the current transducer maybe placed directly in series with the secondary winding or windings. In other variants of the embodiment of FIG. 11, equivalent known methods may be applied as the measuring systems of the magnetizing current or the flux density in the transformer core. Such system may employ for instance, a Hall effect magnetic field transducer, a magnetic ear, or a Rogovski coil. This alternative is presented in FIG. 11 in the alternative arrangement of the comparator A8, where comparator A8 is arranged to receive a maximum flux density Bmax and the absolute value of the actual flux density |B| on the inputs.

Figure 12:
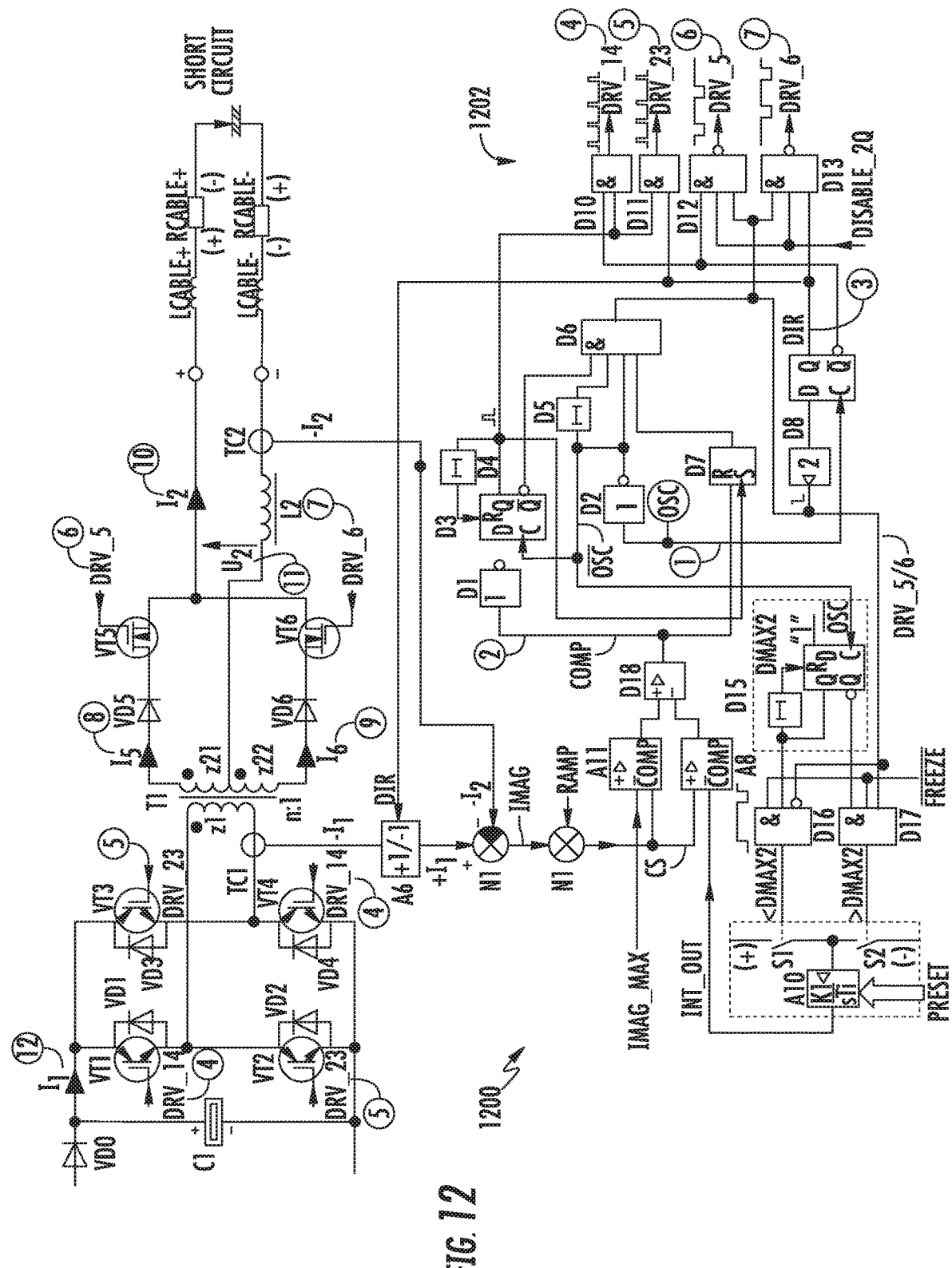
FIG. 12 shows a further power supply arranged according to embodiments of the disclosure.

Turning now to FIG. 12, there is shown another embodiment of a power supply 1200 that also employs a measuring system of the magnetizing current sense, derived from primary and secondary currents, in a different manner than the previous embodiments. Since the maximum magnetizing current may vary depending on the variations of cores and is also temperature dependent, this embodiment employs an adaptive circuit, based on the principle of an anti-windup circuit, described in the embodiment of FIG. 9. As shown in FIG. 12, a control system 1202 is provided, including a generator D15 that produces a Dmax2 signal, synchronized from theoscillator OSC. The Dmax2 signal is compared with the PWM signal DRV_5/6 in the logic gates D16 and D17. Depending on the phase shift between those signals, a switch S1 or switch S2 is closed, and the integrator A10 is driven either up or down. When the average PWM signal DRV_5/6 has a duty cycle less than Dmax2, the switch S1 is closed for a longer time than the switch S2 and the output signal of the integrator A10 goes up. At a certain point of time the integrator may by balanced, meaning that the switches S1 and S2 are activated for the same time. This point is reached when the average value of the DRV-5/6 is equal Dmax2. Due to the same setting of the magnetizing current reference, the tow PWM signals, DRV_5 and DRV_6, tend to equalize and eventually stabilize on the value equal to D2max. At this point switches S1 and S2 may remain opened. In addition, the integrator A10 may be loaded with a preset value, corresponding to the expected magnetizing current in the system. In some embodiments the preset value may be a value measured during the previous operation and restored before the start of operation. As further shown in FIG. 12, a signal INT_OUT from the output of the integrator A10 is compared in the comparator A8 with a CS signal, which signal is proportional to the magnetizing current or proportional to the magnetizing current plus ramp. In one embodiment, a second comparator, comparator A11, may be included, where the comparator A11 uses a constant reference of the maximum expected magnetizing current. As shown in FIG. 12, A8 output and A11 output are connected via an OR logic gate D18 to produce the width modulated COMP signal. The duty cycle may be defined by the signal from the integrator A10 or by a given maximum value of the magnetizing current.

Notably, in aforementioned embodiments the length of the pulse needed for forcing the ZCS switching is dependent on the output current h, shown as the input to the time delay element D4. The secure a ZCS condition, other methods are possible. In particular, in a simple embodiment, the time delay produced by the element D14 may be chosen constant with the respect to the biggest expected output current.

Figure 13:
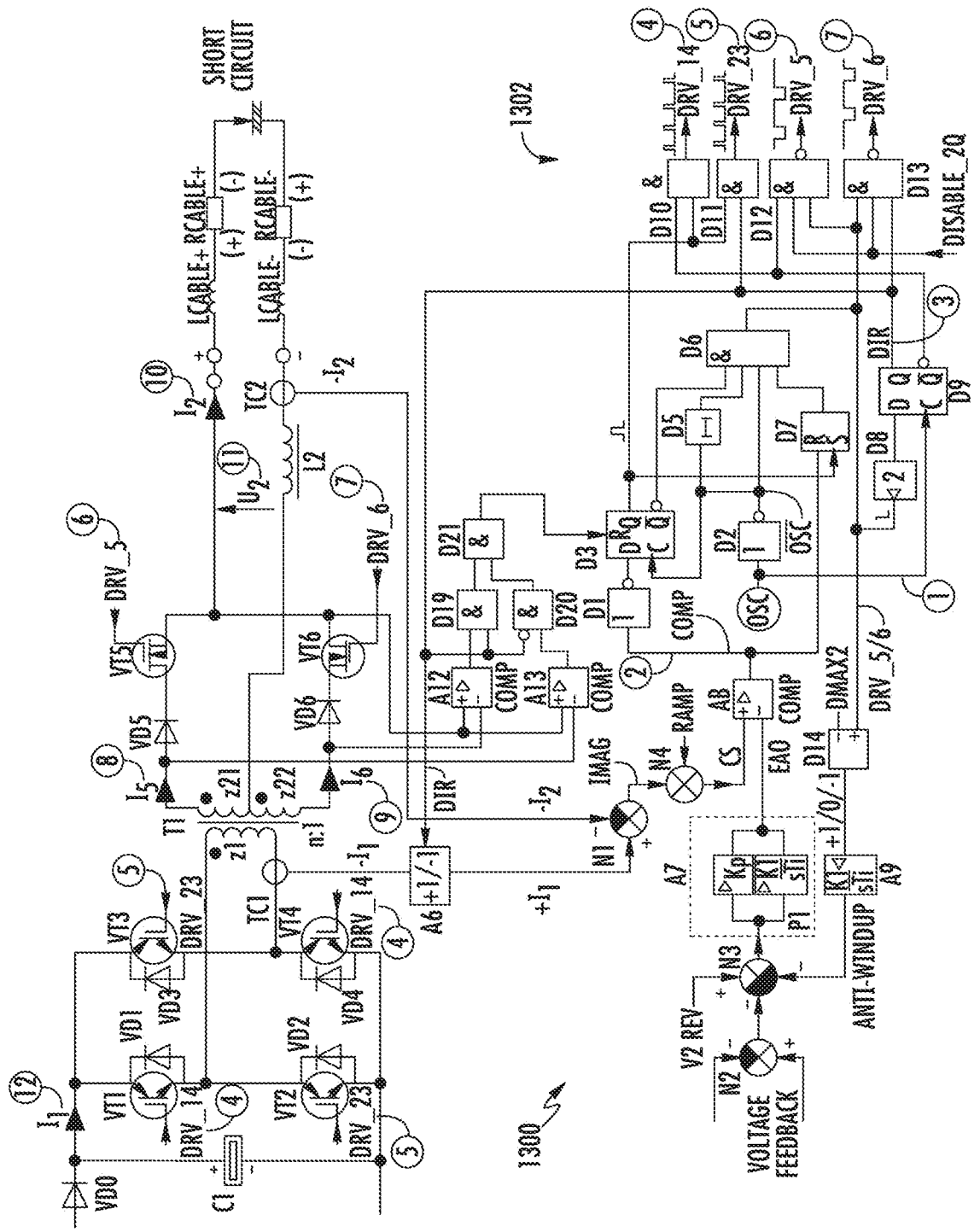
FIG. 13 shows another power supply arranged according to embodiments of the disclosure.

Turning now to FIG. 13 there is shown an embodiment of a power supply 1300 including a control system 1302 where ZCS switching may also be ensured by detection of the voltage drop over the active rectifiers. Since an active rectifier is formed by a diode and a switch, virtually any value of the current creates a forward voltage drop. In the control system 1302 comparator A12 and comparator A13 are used as voltage detectors coupled to VT6-VD6 and VT5-VD5 active rectifiers, respectively. The comparators may be gated in respective phase of operation by means of a DIR signal in the AND gates D19 and D20, where the output of D19 and D20 is summed in the logic OR gate D21 to produce a reset signal for the trigger D3. The manner of creation of the ZCS forcing signals and the securing of the ZCS presented in the present and previous embodiments may be applied in various equivalent embodiments, where the ZCS of the secondary active rectifiers is forced by the operation of the primary switches.

Figure 14:
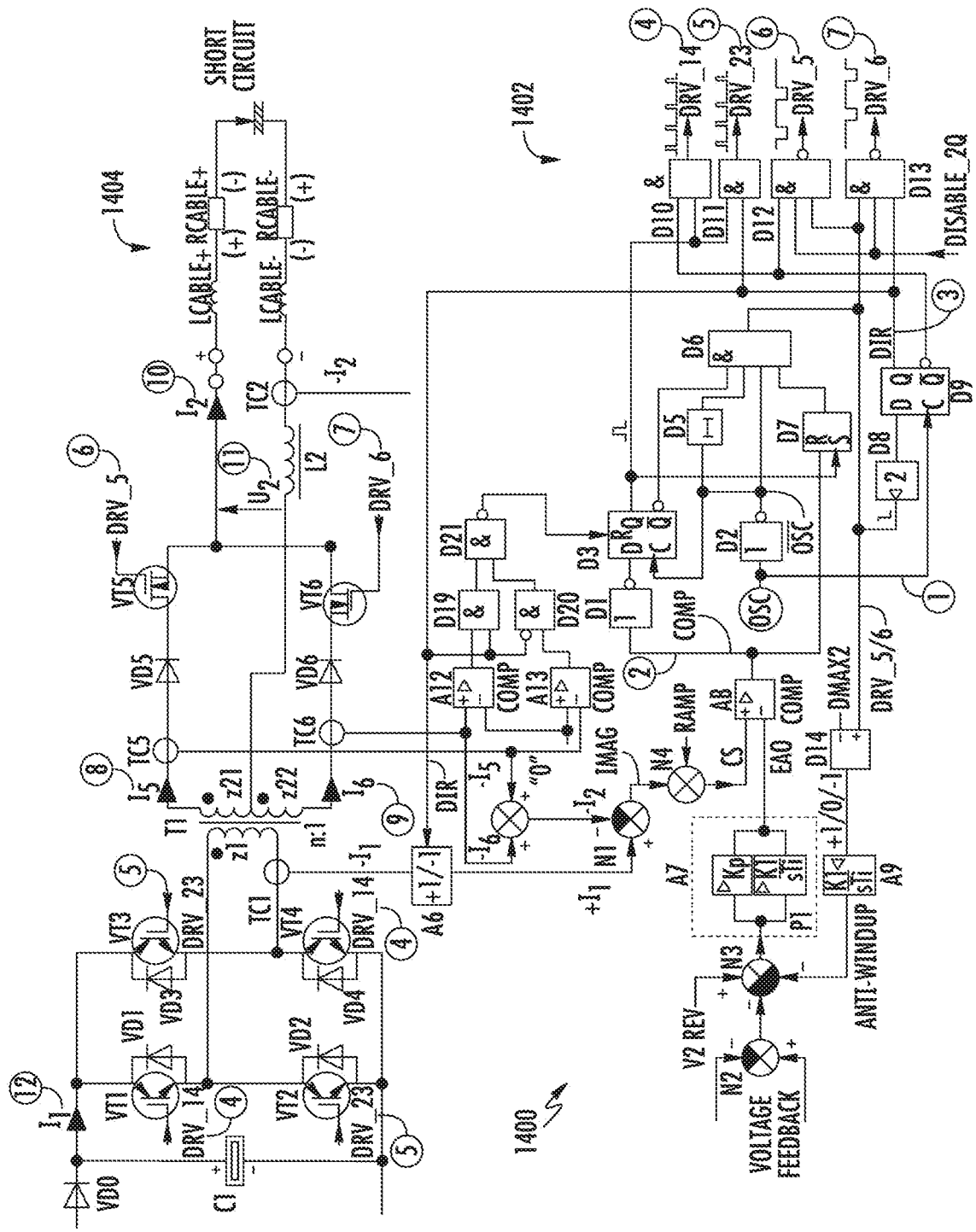
FIG. 14 depicts another power supply according to additional embodiments of the disclosure.

The voltage detection presented in the embodiment of FIG. 13, as well as the current dependent delay presented in the embodiment of FIG. 9 may be considered to be indirect methods of zero current definition. Another embodiment of the control system employing direct current sensing in the arms of the active rectifier is presented in FIG. 14. As shown therein, a power supply 1400 includes a control system 1402 and power block 1404, including a current transducer TC5 and current transducer TC6, which transducers are used in conjunction with comparators A12 and A13 to sense the zero current crossing. At that point, the trigger D3 is reset in the same way as in the previous embodiment. Once current transducers TC5 and TC6 are implemented in power block 1404, the current transducer TC2 may in some implementations provide redundant information to the signals produced by TC5 and TC6, since the 12 current detected by current transducer TC2 is the sum of the respective signals detected by TC5 and TC6, $I_5$ and $I_6$. Accordingly, in one embodiment, the current transducer TC2 may be omitted. In other embodiments, TC5 and TC6 may be implemented not as current transducers, rather as current sensors having a binary output. In such embodiments, the current transducer TC2 is also included in the power block 1404, and signals from binary output current sensors, TC5 and TC6, are directly connected to the inputs of D19 and D20 logic gates, bypassing the comparators, A12 and A13.

Figure 15:
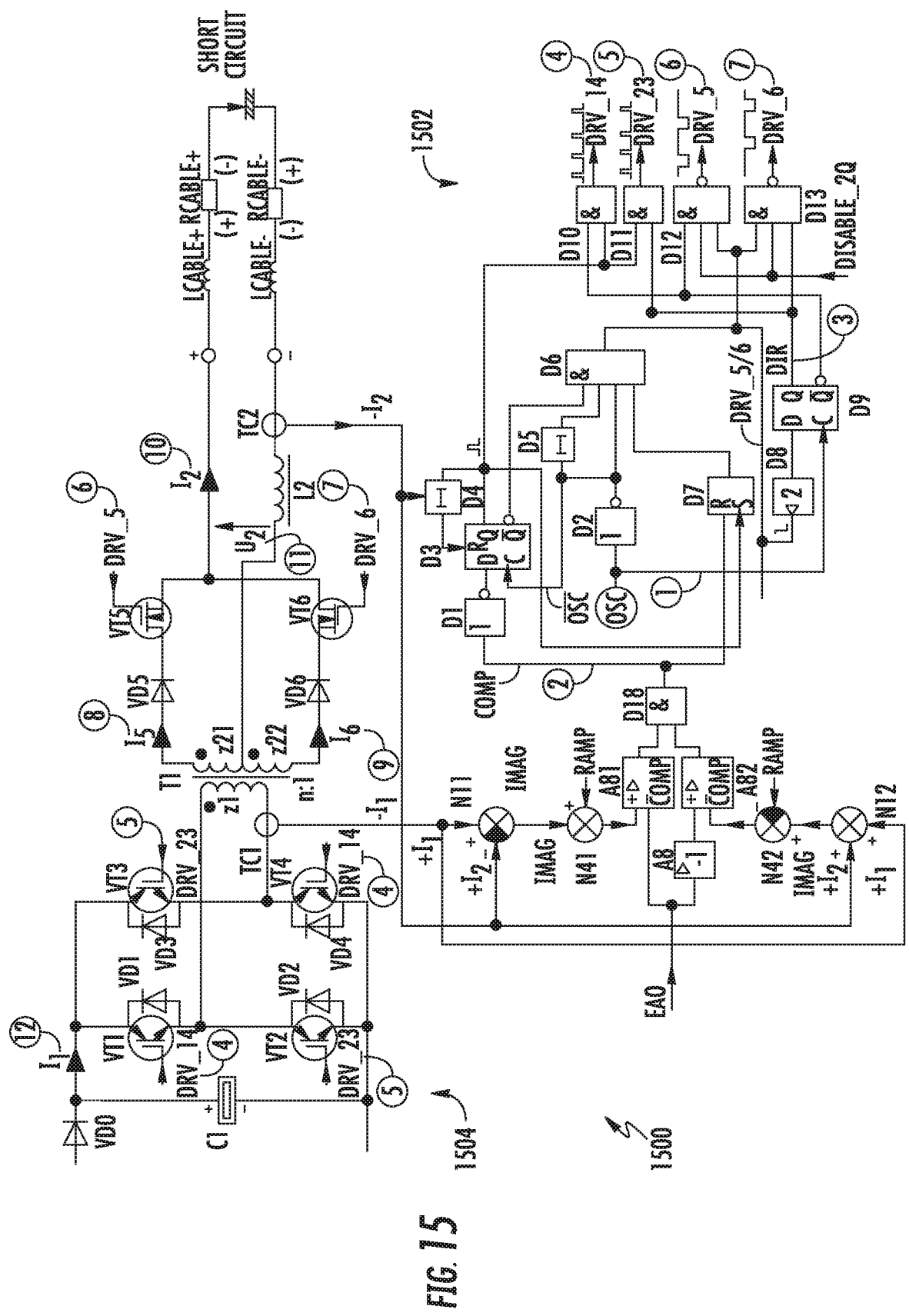
FIG. 15 depicts another power supply according to additional embodiments of the disclosure.

The utilization of a measuring system that provides the unipolar signal proportional the absolute value of the magnetizing current and the single PWM comparator, as shown in previous embodiments, may be replaced by a measuring system that produces a bipolar signal or bipolar signals periodically proportional to the magnetizing current sense as in the embodiment shown in FIG. 15. As shown therein, a power supply 1500 includes a control system 1502 and a power block 1504. The power supply 1500 utilizes two summing nodes N11 and N12, where a signal proportional to the secondary current is subtracted in the first node and added in the second node. The bipolar output signals from those nodes (N11 and N12) are proportional to the magnetizing current just during the active phases of the operation. In non-active phases a particular signal may be not proportional to the magnetizing current, while the signal is not utilized in these non-active phases. Respectively two more nodes N41 and N42 for the implementation of the ramp signal and two PWM comparators A81 and A82 are applied. The feedback signal delivered to the non-inverting input of the second PWM comparator A82 is an inversed original EAO signal or any equivalent PWM reference signal, as is depicted by the presence of the amplifier A25 with −1 gain. The ramp signal given to the second summing node N42 is subtracted from the signal coming from the node N12, oppositely to the operation of the node N41, where the ramp signal is added to the signal from the node N11. The outputs of the comparator A81 and comparator A82 are coupled to a logic circuit, which circuit is schematically represented by the gate D18. In different variants of the disclosure, the logic circuit may be more complex, for instance it may include blanking the comparator that does not correspond to the active phase of the operation.

In summary, according to various embodiments the apparatus and circuitry may provide novel techniques and approaches for operating a power supply, such as a welding power supply.

In a first method embodiment a method for operating a power supply for welding may include providing during a first interval a first energy flow between a source of energy and an energy receiver, wherein a source current flows in a first direction, wherein an output current flows in the first direction and an output voltage of the power supply has a first polarity. The method may also include providing during a second interval a second energy flow between the energy receiver and the source of energy, wherein the source current flows in a second direction, opposite the first direction, wherein the output current flows in the first direction and the output voltage of the power supply has a second polarity opposite the first polarity; and may further include providing during a third interval a zero energy flow, wherein current does not flow through the source of energy and a current circulates in the first direction in the receiver.

Alternatively, or in addition, in a second method embodiment the power supply of the first method embodiment may comprise a secondary side having an active rectifier block, where the active rectifier block includes a plurality of controlled rectifiers, wherein a portion of controlled rectifiers of the active rectifier block is turned off to force initiation of the second interval and to counter the third interval.

Alternatively, or in addition, in a third method embodiment, the power supply of the first method embodiment may comprise a controller configured to generate PWM modulation, wherein the PWM modulation is applied during the second interval and the third interval to regulate average output voltage.

Alternatively, or in addition, in a fourth method embodiment, a power supply control of the first method embodiment may comprise a controller configured to generate PWM modulation, wherein the PWM modulation is applied during the second interval and the third interval to balance magnetic flux in the transformer and to protect the transformer against saturation.

Alternatively, or in addition, in a fifth method embodiment, during the first interval the power supply of the second method embodiment may employ primary switches to force a zero current switching condition of the controlled rectifiers in the active rectifierblock.

Alternatively, or in addition, in a sixth method embodiment, power supply control of the fifth method embodiment may employ a current-dependent delay to define a time in the first interval of forcing a secondary current in the secondary side to zero.

Alternatively, or in addition, in a seventh method embodiment the power supply control of the fifth method embodiment may employ voltage sensors or current sensors to define a time in the first interval of forcing a secondary current in the secondary side to zero.

Alternatively, or in addition, in a eighth method embodiment the power supply control of the fourth method embodiment may employ a comparison with predicted magnetizing current or maximum flux density for balancing the flux or protecting against saturation.

Alternatively, or in addition, in a ninth method embodiment the power supply control of the second method embodiment may employ an anti-windup system comparing an actual duty cycle of an OFF operation of the active rectifier block with a reference value to prevent an output voltage control system against saturation.

Alternatively, or in addition, in a tenth method embodiment the power supply control of the second method embodiment may employ an anti-windup system comparing an actual duty cycle of the OFF operation of the active rectifier block with a reference value to setup a predicted magnetizing current.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Thus, the claims set forth below are to be construed in view of the full breadth and spirit of the present disclosure as described herein.

What is claimed is:

1. A power supply, comprising:
a power block to receive an input power and generate an output power; and a control system coupled to the power block, wherein the power block and
control system are arranged to provide unidirectional current flow and bipolar voltage during operation of the power supply,
wherein the power block comprises a primary side and a secondary side, the primary side and secondary side being coupled to one another via a transformer, wherein the secondary side comprises an active rectifier block,
wherein the power block comprises a primary current transducer and a secondary current transducer, and
wherein the control system includes a sign alternator, driven by an output of a PWM phase trigger, that receives an output of the primary current transducer and outputs a signal that is summed with an output of the secondary current transducer to provide a control signal that is used to control the active rectifier block.

2. The power supply of claim 1, wherein the power block and control system are arranged to operate in a first current-voltage quadrant and a second current-voltage quadrant adjacent the first current-voltage quadrant.

3. The power supply of claim 1, wherein the power block comprises an energy accumulator and a primary converter having a plurality of switches, wherein the control system comprises circuitry to generate pulse width modulation control of the primary converter.

4. The power supply of claim 1, wherein the active rectifier block of the secondary side comprises a plurality of switches, wherein the control system comprises circuitry to generate pulse width modulation control of the active rectifierblock.

5. The power supply of claim 1, wherein the active rectifier block comprises a center tap active rectifier.

6. The power supply of claim 1, wherein the active rectifier block comprises a full bridge active rectifier.

7. The power supply of claim 1, wherein the active rectifier block comprises a current doubler active rectifier.

8. The power supply of claim 1, wherein the active rectifier block comprises at least a pair of controlled rectifiers, the pair of controlled rectifiers providing equivalent operation to a pair of switches coupled in series to a respective pair of diodes.

9. The power supply of claim 1, wherein the control system comprises a measuring system that produces a unipolar signal proportional to an absolute value of a magnetizing current of a power transformer by superposition of a first signal and a second signal, the first signal being proportional to a primary current of the transformer and having periodically altered polarity, the second signal being proportional to a secondary current.

10. The power supply of claim 1, wherein the control system comprises a measuring system that produces a signal, the signal being proportional to a magnetizing current of the transformer.

11. The power supply of claim 1, wherein the control system comprises an anti-windup system, the anti-windup system comprising a digital comparator and an integrator.

12. The power supply of claim 2, wherein the first current-voltage quadrant comprises positive current and positive voltage and the second current-voltage quadrant comprises positive current and negative voltage.

13. The power supply of claim 2, wherein the first current-voltage quadrant comprises negative current and negative voltage and the second current-voltage quadrant comprises negative current and positive voltage.

14. The power supply of claim 8,
wherein the active rectifier block comprises a first controlled rectifier and a second controlled rectifier,
wherein the power block comprises:
a first current transducer or a first current sensor, the first current transducer or the first current sensor being disposed in series with the first controlled rectifier; and
a second current transducer or a second current sensor, the second current transducer or the second current sensor being disposed in series with the second controlled rectifier, and
wherein the control system comprises:
a first comparator directly coupled to the first current transducer or to the first current sensor; and
a second comparator directly coupled to the second current transducer or to the second current sensor.

* * * * *